(12) United States Patent
Fitzgerald et al.

(10) Patent No.: US 9,330,999 B2
(45) Date of Patent: May 3, 2016

(54) MULTI-COMPONENT INTEGRATED HEAT SPREADER FOR MULTI-CHIP PACKAGES

(71) Applicant: Intel Corporation, Santa Clara, CA (US)

(72) Inventors: Thomas J. Fitzgerald, Phoenix, AZ (US); Aravindha R. Antoniswamy, Chandler, AZ (US); Carl L. Deppisch, Chandler, AZ (US); Nikunj P. Patel, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/296,743

(22) Filed: Jun. 5, 2014

(65) Prior Publication Data
US 2015/0357258 A1      Dec. 10, 2015

(51) Int. Cl.
*H01L 21/00*     (2006.01)
*H01L 23/367*    (2006.01)
*H01L 21/48*     (2006.01)

(52) U.S. Cl.
CPC ........ *H01L 23/3675* (2013.01); *H01L 21/4882* (2013.01); *Y10T 29/49352* (2015.01)

(58) Field of Classification Search
None
See application file for complete search history.

(56) References Cited

U.S. PATENT DOCUMENTS

| | | | | |
|---|---|---|---|---|
| 6,046,498 A * | 4/2000 | Yoshikawa | .......... | H01L 23/4338 257/706 |
| 6,329,711 B1 * | 12/2001 | Kawahara | ........... | H01L 21/4832 257/698 |
| 6,432,742 B1 * | 8/2002 | Guan | ................... | H01L 23/4334 257/706 |
| 6,933,537 B2 * | 8/2005 | Yee | ..................... | H01L 51/5237 257/100 |
| 7,388,284 B1 * | 6/2008 | Zhang | ..................... | H01L 23/10 257/684 |
| 2001/0002729 A1* | 6/2001 | Wong | .................. | H01L 23/4093 257/706 |

* cited by examiner

*Primary Examiner* — Benjamin Sandvik
*Assistant Examiner* — Herve Assouman
(74) *Attorney, Agent, or Firm* — Winkle, PLLC

(57) ABSTRACT

A multi-component heat spreader comprising a top component having a first surface and an opposing second surface with either a cavity extending therein from the second surface thereof or a projection extending from the second surface thereof. The multi-component heat spreader further includes at least one additional component, such as a footing component or a spacer component, having a first surface and an opposing second surface with either a cavity extending therein from the second surface thereof or a projection extending from the second surface thereof, which is opposite from the top component cavity/projection. The additional component is attached to the top component, such as by brazing, wherein the top component cavity/projection is mated to the additional component cavity/projection.

11 Claims, 8 Drawing Sheets

US 9,330,999 B2

MULTI-COMPONENT INTEGRATED HEAT SPREADER FOR MULTI-CHIP PACKAGES

TECHNICAL FIELD

Embodiments of the present description generally relate to the removal of heat from microelectronic devices, and, more particularly, to integrated heat spreaders formed with multiple components.

BACKGROUND

Higher performance, lower cost, increased miniaturization of integrated circuit components, and greater packaging density of integrated circuits are ongoing goals of the microelectronic industry. As these goals are achieved, microelectronic devices become smaller. Accordingly, the density of power consumption of the integrated circuit components in the microelectronic devices has increased, which, in turn, increases the average junction temperature of the microelectronic device. If the temperature of the microelectronic device becomes too high, the integrated circuits of the microelectronic device may be damaged or destroyed. This issue becomes even more critical when multiple microelectronic devices are incorporated in close proximity to one another in a multiple microelectronic device package, also known as a multi-chip package. Thus, thermal transfer solutions, such as integrated heat spreaders, must be utilized to remove heat from the microelectronic devices. However, the difficulty and cost of fabricating current designs for integrated heat spreaders has become an issue for the microelectronic industry.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
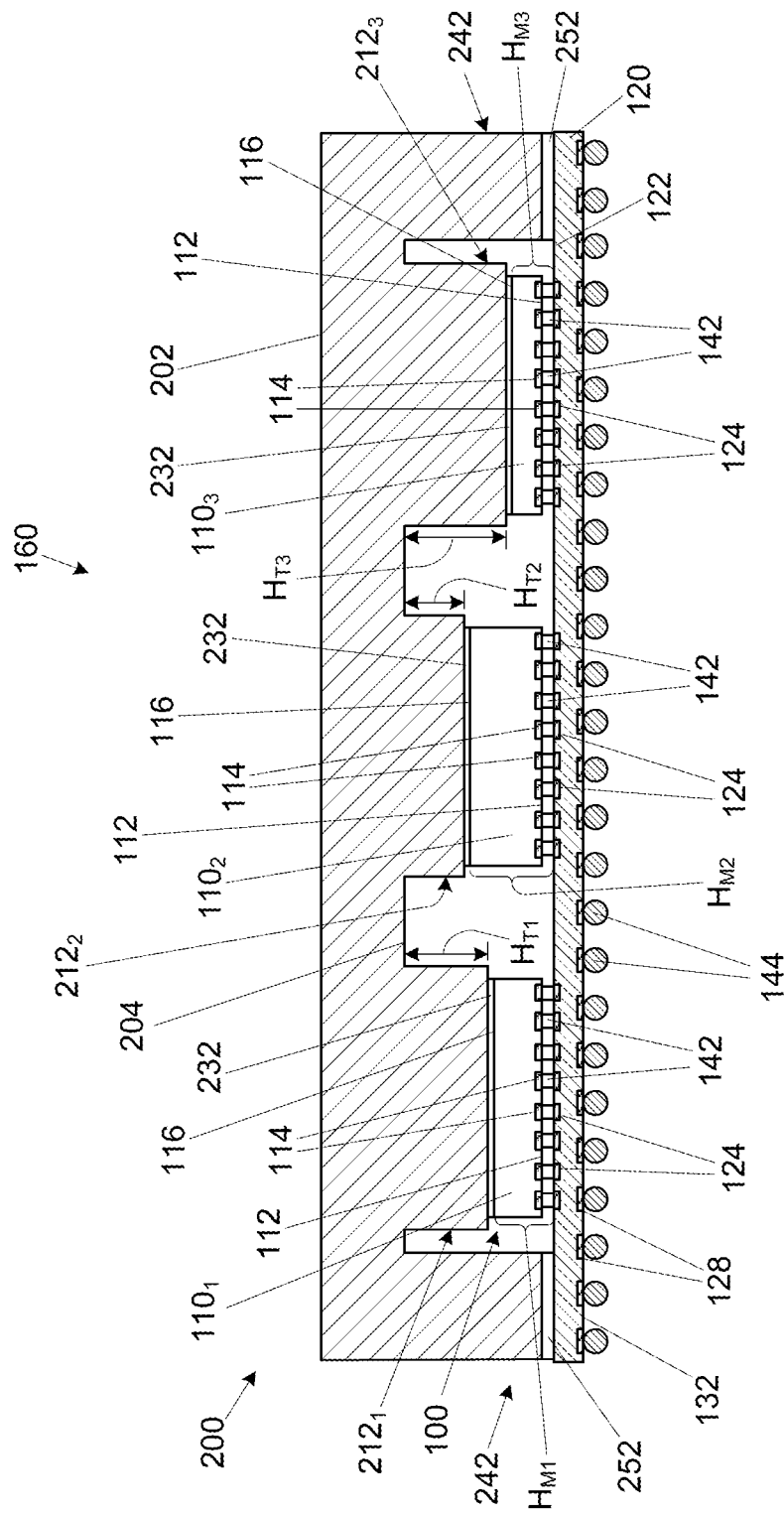
FIG. 1 is a side cross-sectional view of a microelectronic system, as known in the art.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

FIG. 1 illustrates microelectronic system having a multi-chip package coupled with a known integrated heat spreader. In the production of microelectronic systems, multi-chip packages are generally mounted on microelectronic substrates, which provide electrical communication routes between the microelectronic packages and external components. As shown in FIG. 1, a multi-chip package 100 may comprise a plurality of microelectronic devices (illustrated as elements $110_1$, $110_2$, and $110_3$), such as microprocessors, chipsets, graphics devices, wireless devices, memory devices, application specific integrated circuits, or the like, attached to a first surface 122 of a microelectronic substrate 120 through a plurality of interconnects 142, respectively, such as reflowable solder bumps or balls, in a configuration generally known as a flip-chip or controlled collapse chip connection ("C4") configuration. The device-to-substrate interconnects 142 may extend from bond pads 114 on an active surface 112 of each of the microelectronic devices $110_1$, $110_2$, and $110_3$ and bond pads 124 on the microelectronic substrate first surface 122. The microelectronic device bond pads 114 of each of the microelectronic devices $110_1$, $110_2$, and $110_3$, may be in electrical communication with integrated circuitry (not shown) within the microelectronic devices $110_1$, $110_2$, and $110_3$. The microelectronic substrate 120 may include at least one conductive route (not shown) extending therethrough from at least one microelectronic substrate first surface bond pad 124 and at least one external connection bond pad 128 on or proximate a second surface 132 of the microelectronic substrate 120. The microelectronic substrate 120 may reroute a fine pitch (center-to-center distance between the microelectronic device bond pads 114) of the microelectronic device bond pads 114 to a relatively wider pitch of the external connection bond pads 128. External interconnection structures 144 may be attached to each external connection bond pad 128. The external interconnection structures 144 may be any appropriate structures, such as solder balls (shown), used for reflow attachment to external structures (not shown), or pins (not shown) used for the insertion into an external socket (not shown), as will be understood to those skilled in the art.

The microelectronic substrate 120 may be primarily composed of any appropriate substrate material, including, but not limited to, bismaleimine triazine resin, fire retardant grade 4 material, polyimide materials, glass reinforced epoxy matrix material, and the like, as well as laminates or multiple layers thereof. The microelectronic substrate conductive routes (not shown) may be composed of any conductive material, including but not limited to metals, such as copper and aluminum, and alloys thereof. As will be understood to those skilled in the art, the microelectronic substrate conductive routes (not shown) may be formed as a plurality of conductive traces (not shown) formed on layers of dielectric material (constituting the layers of the microelectronic substrate material), which are connected by conductive vias (not shown).

The device-to-substrate interconnects 142 can be made of any appropriate conductive material, including, but not limited to, solders materials. The solder materials may be any appropriate material, including but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. When the microelectronic devices $110_1$, $110_2$, and $110_3$ are attached to the microelectronic substrate 120 with device-to-substrate interconnects 142 made of solder, the solder is reflowed, either by heat, pressure, and/or sonic energy to secure the solder between the microelectronic device bond pads 114 and the microelectronic substrate bond pads 124.

As further illustrated in FIG. 1, an integrated heat spreader 200 may be in thermal contact with the multi-chip package 100, to form a microelectronic system 160. The integrated heat spreader 200 may be made of any appropriate thermally conductive material, such a metals and alloys, including, but not limited to, copper, aluminum, and the like.

The integrated heat spreader 200 may have a first surface 202 and an opposing second surface 204, wherein the integrated heat spreader 200 includes a plurality terraces (illustrated as elements $212_1$, $212_2$, and $212_3$) extending from the integrated heat spreader second surface 204. As illustrated, the integrated heat spreader terraces $212_1$, $212_2$, and $212_3$ may have differing heights $H_{T1}$, $H_{T2}$, and $H_{T3}$ extending from the integrated heat spreader second surface 204 to compensate for differing heights $H_{M1}$, $H_{M2}$, and $H_{M3}$ of the microelectronic devices $110_1$, $110_2$, and $110_3$ (i.e. the distance between the microelectronic substrate first surface 122 and a back surface 116 of each microelectronic devices $110_1$, $110_2$, and $110_3$), respectively, in order to make thermal contact therebetween. A thermal interface material 232, such as a thermally conductive grease or polymer, may be disposed between each integrated heat spreader terrace $212_1$, $212_2$, and $212_3$ and its respective back surface 116 of each microelectronic device $110_1$, $110_2$, and $110_3$ to facilitate heat transfer therebetween.

The integrated heat spreader 200 may include at least one footing 242 extending between the integrated heat spreader second surface 204 and the microelectronic substrate 120, wherein the integrated heat spreader footing 242 may be attached to the microelectronic substrate first surface 122 with an adhesive material 252.

As will be understood to those skilled in the art, the fabrication of the integrated heat spreader 200 requires expensive stamping equipment able to achieve high tonnage stamping forces in order to form complex elements, such as illustrate integrated heat spreader terraces $212_1$, $212_2$, and $212_3$. For example, for a copper integrated heat spreader, such as oxygen-free copper (99.99%), a 600 ton stamping machine may be required to form such integrated head spreader terraces and even then there is doubt to whether a 600 ton press would be capable of stamping such integrated heat spreaders to required tolerances. Furthermore, it is currently not possible to feasible make integrated heat spreaders thicker than 4 mm from a single roll of copper coil due to the difficulty of winding and unwinding such thick material.

Embodiments of the present description relate to integrated heat spreaders formed from multiple components, such that complex and expensive stamping processes are not needed. The multi-component heat spreader may comprise a top component having a first surface and an opposing second surface with either a cavity extending therein from the second surface thereof or a projection extending from the second surface thereof. The multi-component heat spreader further includes at least one additional component, such as a footing component or a spacer component, having a first surface and an opposing second surface with either a cavity extending therein for the second surface thereof or a projection extending from the second surface thereof, which is opposite of the top component cavity/projection. The additional component is attached to the top component, such as by brazing, wherein the top component cavity/projection is mated to the additional component cavity/projection.

Figure 2:
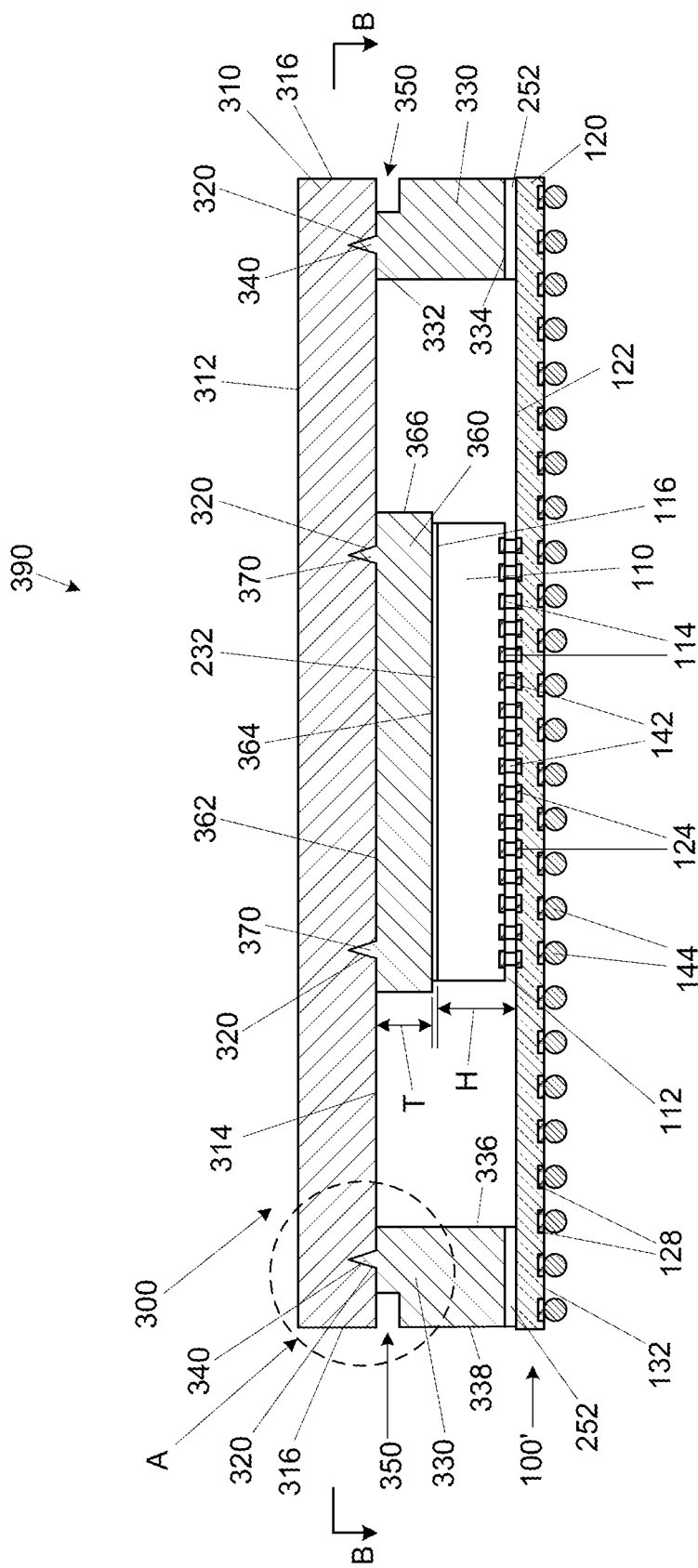
FIG. 2 is a side cross-sectional view of a microelectronic system, according to an embodiment of the present description.

As illustrated in FIG. 2, a multi-component integrated heat spreader 300 according to one embodiment of the present description may be in contact with a multi-chip package 100', which is similar to the multi-chip package 100 of FIG. 1 to form a microelectronic system 390. For the sake of clarity, the multi-chip package 100' of FIG. 2 is illustrated with a single microelectronic die 110; however, it is understood that the multiple microelectronic dice could be utilized, such as shown in FIG. 1. The multi-component integrated heat spreader 300 may include a heat spreader top component 310 having a first surface 312, an opposing second surface 314, and at least one side 316 extending between the top component first surface 312 and the top component second surface 314. The heat spreader top component 310 may further include at least one cavity 320 extending into the heat spreader top component 310 from the top component second surface 314.

As further illustrated in FIG. 2, the multi-component integrated heat spreader 300 may include a footing component 330 having a first surface 332, a second surface 334 opposing the first surface 332, an interior surface 336 extending between the footing component first surface 332 and the footing component second surface 334, and an external surface 338 opposing the footing component interior surface 336. The footing component 330 may include at least one projection 340 extending from the footing component first surface 332, wherein the footing component projection 340 may be positioned within or "mated" with a corresponding top component cavity 320. The footing component(s) 330 may be positioned proximate the top component side 316. In one embodiment, the footing component exterior surface 338 may be substantially planar to the top component side 316.

The multi-component integrated heat spreader 300 may further include at least one spacer component 360 having a first surface 362, an opposing second surface 364, and at least one side 366 extending between the spacer component first surface 362 and the spacer component second surface 364, wherein the spacer component first surface 362 may be attached to the top component second surface 314, such as by brazing. The spacer component 360 may include at least one projection 370 extending from the spacer component first surface 362, wherein each spacer component projection 370 may be positioned within or mated with a corresponding top component cavity 320.

The spacer component 360 may have a thickness T measured from the spacer component first surface 362 to the spacer component second surface 364. The thickness T of the spacer component 360 may be selected to compensate for the height H of the microelectronic device 110 (i.e. the distance between the microelectronic substrate first surface 122 and the microelectronic device back surface 116) in order to make thermal contact therebetween. Thermal interface material 232, such as a thermally conductive grease or polymer, may be disposed between the spacer component second surface 364 and microelectronic device back surface 116 to facilitate heat transfer therebetween. It is understood that a plurality of spacer components 360 may used in conjunction with a plurality of corresponding microelectronic devices 110, such as discussed with regard in FIG. 1 regarding the integrated heat spreader terraces $212_1$, $212_2$, and $212_3$ and the microelectronic devices $110_1$, $110_2$, and $110_3$.

The top component 310, the footing component(s) 330, and the spacer component(s) 360 may be made of any appropriate metal, including, but not limited to, copper, aluminum, silver, gold, and the like. In one embodiment, the top component 310 and/or the spacer(s) 360 may be formed from a highly thermally conductive, oxygen-free copper. As the footing component 330 may not be a significant factor in the removal of heat from the microelectronic device(s) 110, it may be made of less expensive/less thermally conductive material, such as lower grade copper or brass. Further, the top component 310, the footing component(s) 330, and the spacer component(s) 360 may be fabricated by any technique known in the art, including, but not limited to, stamping, blanking, and machining.

Figure 3:
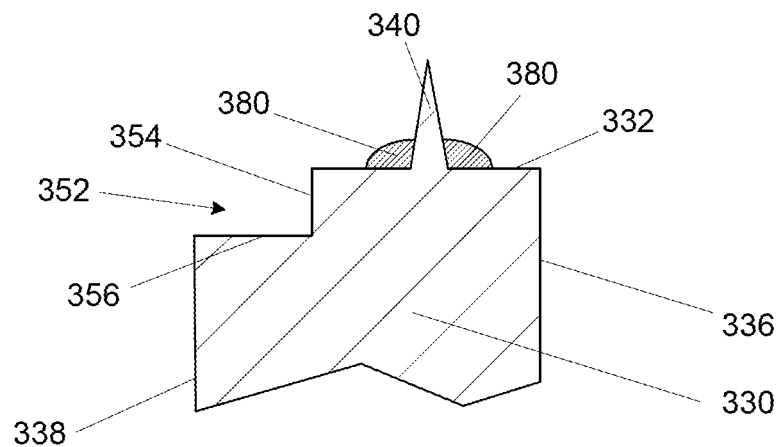
FIG. 3 is an enlarged side cross-sectional view of the footing component within the inset A of FIG. 2 having a brazing material dispensed thereon, according to an embodiment of the present description.
Figure 4:
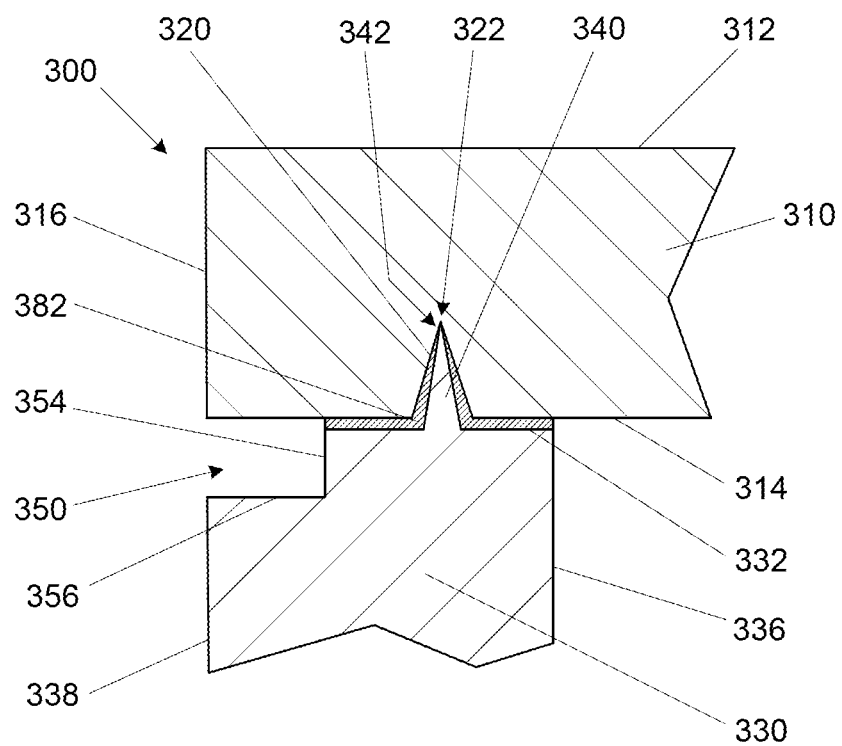
FIG. 4 is an enlarged side cross-sectional view of inset A of FIG. 2, according to an embodiment of the present description.

Referring to FIGS. 3 and 4, for the purposes of the present description, brazing is defined to be an attachment wherein a brazing material 380 is used to attach components of the multi-component integrated heat spreader 300, and wherein the brazing attachment process is conducted at temperatures above about 550° C. The brazing material 380 may include a brazing alloy, such as copper phosphorous alloy and a flux (for adhesion). As shown in FIG. 3, the brazing material 380 may be dispensed abutting the footing component first surface 332 and the footing component projection 340. The illustrate dispensation of the brazing material 380 on the footing component 330 in FIG. 3 is, of course, merely exemplary, as the brazing material 380 may be distributed over the footing component first surface 332 and the footing component projection 340 or may be placed on the top component second surface 314 (see FIG. 2) rather than being placed on the footing component 330. As shown in FIG. 4, the footing component projection 340 may be inserted into its corresponding top component cavity 320, wherein the top component 310 and the footing component 330 may be heated above about 550° C. to melt or reflow the brazing alloy (shown as element 382) of the brazing material 380 (see FIG. 3), such that the brazing alloy 382 is distributed between the top component 310 and the footing component 330 by capillary action thereby bonding the footing component 330 to the top component 310 (it is understood that the flux vaporizes from the brazing material 380 of FIG. 3 during the process leaving the brazing alloy 382 to form the bond). The top component 310 and the footing component 330 may be cooled and machined to remove any excess blazing alloy 382 and/or to improve the finish of the multi-component integrated heat spreader 300 (see FIG. 2). It is understood that low temperature solder material, e.g. melting temperature below about 650° F., may be weak and unstable at elevated temperature, and are not suitable for use in a multi-component heat spreader of the present description.

It will be understood that the top component cavity 320 mating with the footing component projection 340 may align the footing component 330 to the top component 310. As further shown in FIG. 4, a tip 342 of the footing component projection 340 may contact a bottom 322 of the top component cavity 320, which may allow for a reproducible gap between the top component 310 and the footing component 330 for brazing.

Figure 5:
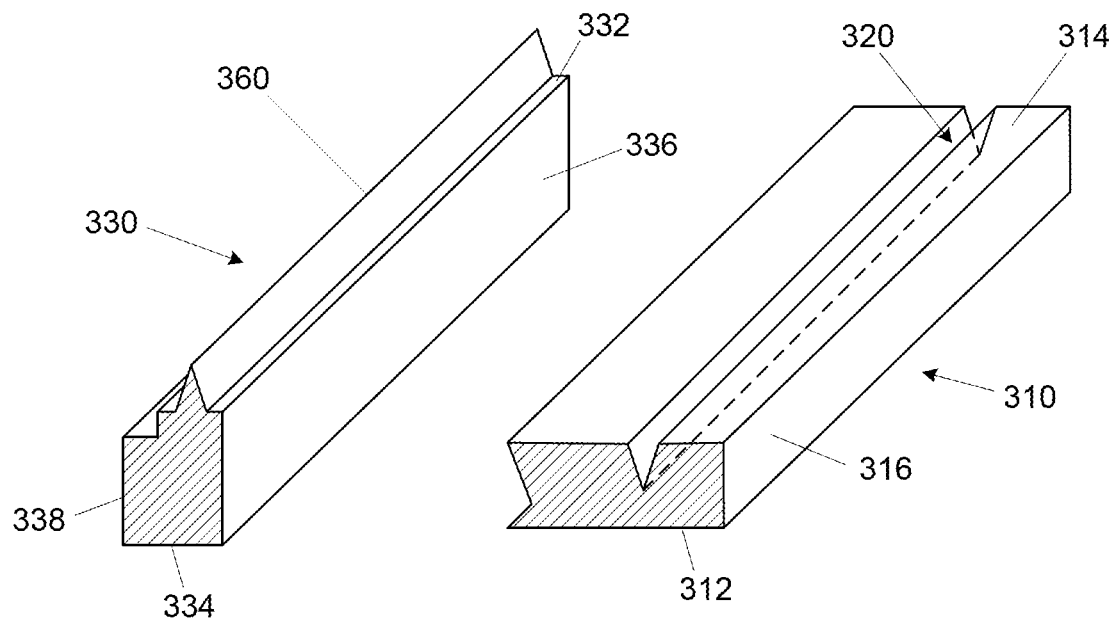
FIG. 5 is an oblique view of heat spreader components, according to an embodiment of the present description.
Figure 6:
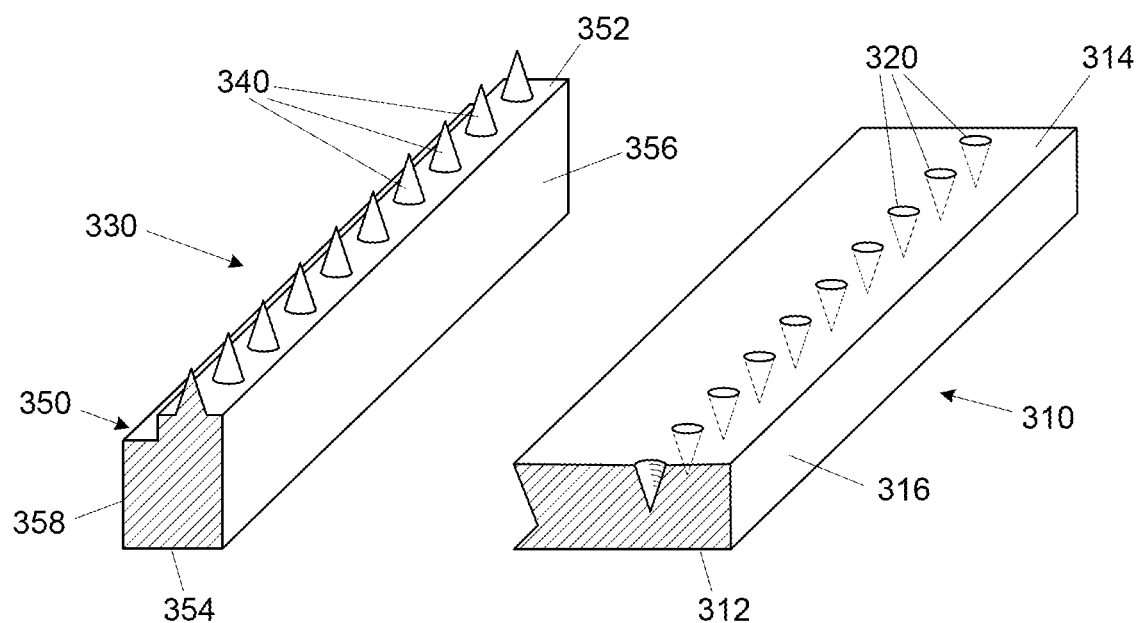
FIG. 6 is an oblique view of heat spreader components, according to another embodiment of the present description.
Figure 7:
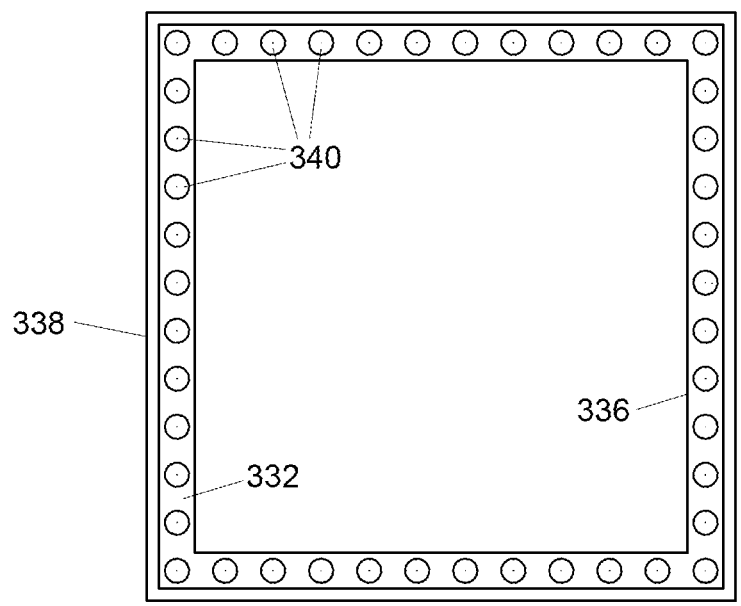
FIG. 7 is a top plan view of the footing component of the integrated heat spreader along line B-B of FIG. 2, according to an embodiment of the present description.
Figure 8:
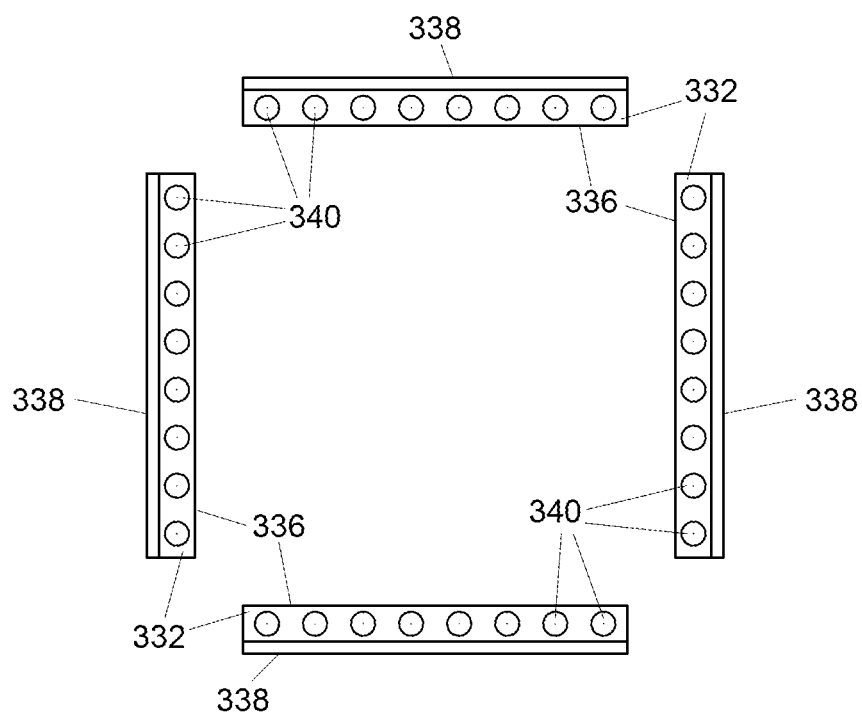
FIG. 8 is a top plan view of the footing component of the integrated heat spreader along line B-B of FIG. 2, according to another embodiment of the present description.

The top component cavity 320 and the footing component projection 340 may have a variety of configurations. By way of example, but not so limited, the top component cavity 320 may be a trench and the footing component projection 340 may be a ridge, as shown in FIG. 5. By way of example, but not by way of limited, the top component cavity 320 may be a plurality of cavities, such as the illustrated conical cavities, and the footing component projection 340 may be a plurality of corresponding projections, such as the illustrated cone-shaped projections, as shown in FIG. 6. As shown in FIG. 7, in one embodiment, the footing component 330 may be a continuous footing, which would enclose the various microelectronic device(s) 110 (see FIG. 2). As shown in FIG. 8, in another embodiment, the footing component 330 may be a plurality of structures appropriately positioned to surround the various microelectronic device(s) 110 (see FIG. 2).

Figure 9:
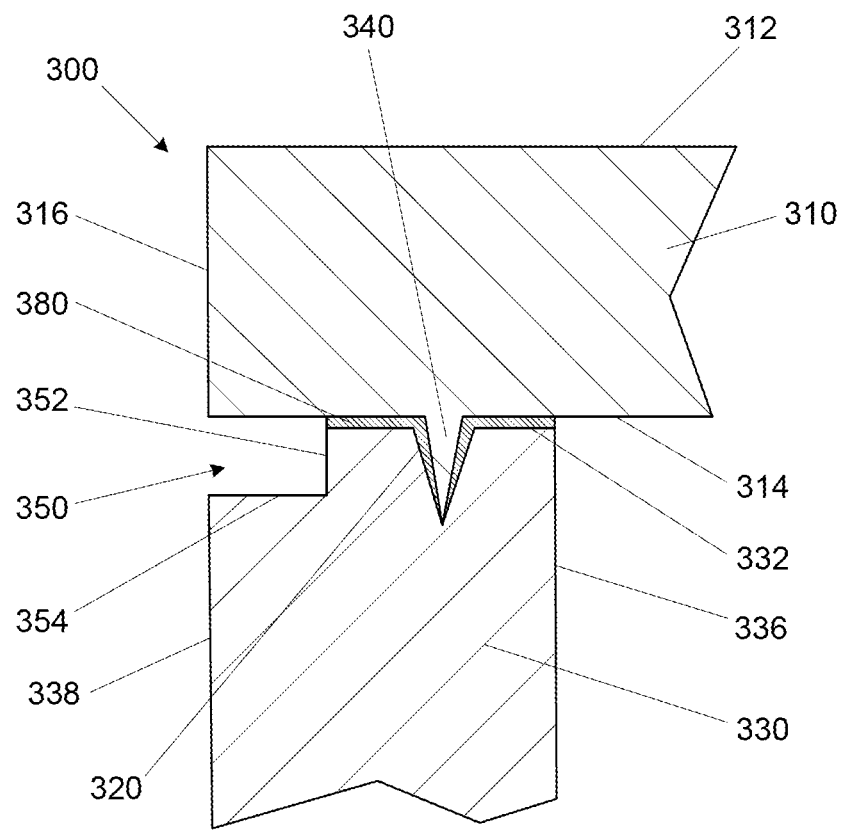
FIG. 9 is a side cross-sectional view of an alternate configuration of the projection and cavity, according to an embodiment of the present description.

Although FIGS. 3-8 are directed toward the footing components 330 having the projection 340 and the top component 310 having the cavity 320, it is understood that it may be reversed such that the footing component 330 has a cavity 320' and the top component 330 having a projection 340', as shown in FIG. 9.

Although FIGS. 3-9 are directed toward illustrating the attachment footing components 330, it is understood that the spacer component 360 may be attached in precisely the same manner and with precisely the same projection/cavity shapes and configurations. Therefore, for the sake of clarity and brevity, the attachment of the spacer component 330 will not be described in detail.

Figure 10:
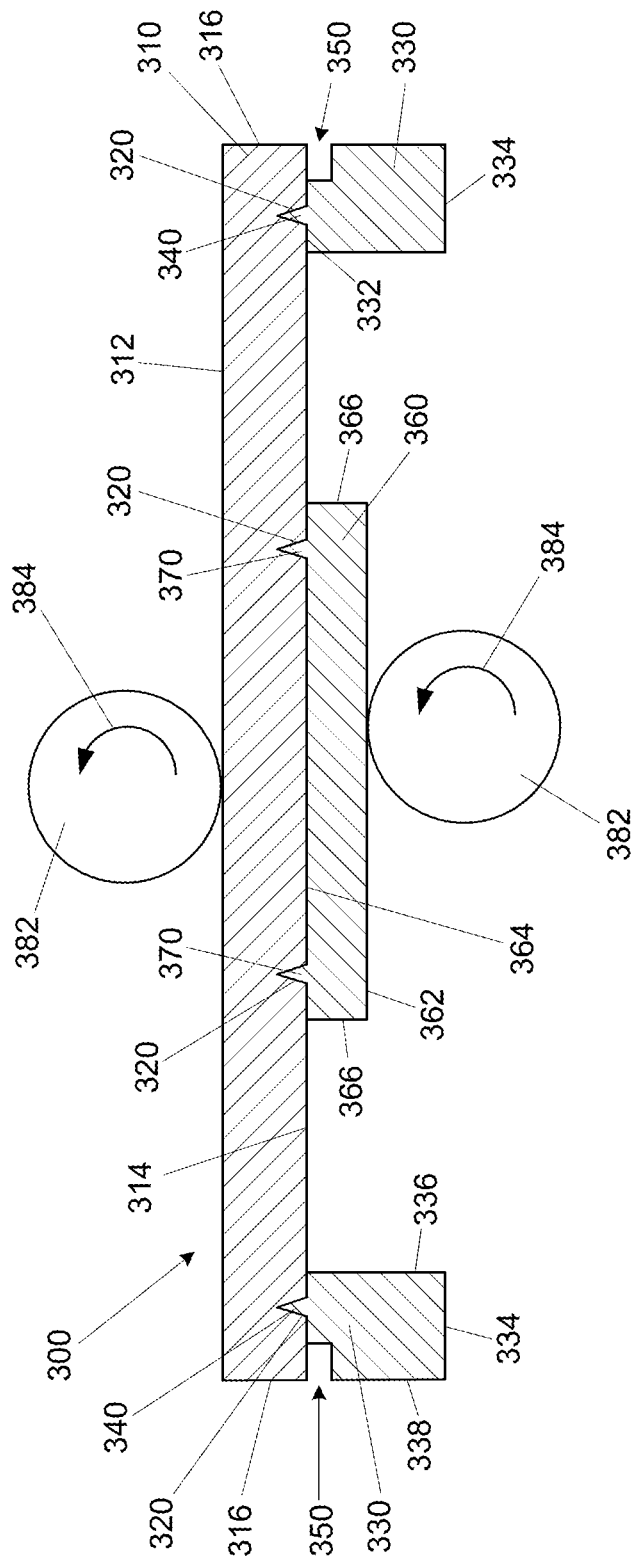
FIG. 10 is a side cross-sectional view of the integrated heat spreader during a leveling process, according to an embodiment of the present description.

As further shown in FIG. 3, the footing component 330 may have an indent 352 defined by a first indent surface 354 and a second indent surface 356. When the top component 310 is attached to the footing component 330, the top component second surface 314, the first indent surface 354, and a second indent surface 356 define a handling feature 350, as shown in FIGS. 2, 4, 9 and 10. This handling feature 350 may be used for gripping the multi-component integrated heat spreader 300 in downstream processing, such as the machining process illustrated in FIG. 10, for insertion and removal of the microelectronic system 390 (see FIG. 2) when the external interconnection structures 144 (see FIG. 2) are socket pins, and the like. In FIG. 10, a leveling device, such as the illustrated rotating planarizing devices 382 (rotation illustrated by arrow 384, may be used to level the spacer component second surface 364 and/or the top component first surface 312. Typically, the appropriate surfaces generally need a flatness of about 20 microns or less to achieve good thermal performance, as will be understood to those skilled in the art. The embodiments of the present description with the machining process illustrated in FIG. 10 can achieve extremely flat surfaces of about 5 microns for improved thermal performance. After the machining process of FIG. 10, the multi-component integrated heat spreader 300 may be optionally plated, such as nickel plating (not shown).

The embodiments of the present disclosure, in comparison with stamped integrated heat spreader do not require a high tonnage press, may allow for integrated heat spreaders to be made from materials thicker than 4 mm, and may allow for rapid production of large and complex integrated heat spreader designs. Furthermore, the embodiments of the present description may have increased package reliability, as they may have a very stable shape over their lifetime. As will be understood to those skilled in the art, highly work hardened metals tend to recrystallize when exposed to high temperatures. Cold stamping processes hardens an integrated heat spreader and the amount of work hardening becomes more important for integrated heat spreaders with complex geometries and varying top component thicknesses. Recrystallization of the metals in the integrated heat spreader may lead to a sudden drop in the yield strength of the integrated heat spreader and it is possible for the integrated heat spreader to plastically deform and lead to failure of the microelectronic package. With increasing complexity of the integrated heat spreaders, this recrystallization risk continues to increase especially for ball grid array packages which need to undergo surface mount technology reflow. The brazing process of the present description may remove most residual stresses/work hardening, as will be understood to those skilled in the art.

Although the present description primarily discusses attachment of the components with a brazing alloy, the subject matter is not necessarily so limited. Other materials may include, but are not limited to, polymers, transient liquid phase bonding materials, and dual component bonding materials. With regard to the dual component bonding materials, one component of the dual component bonding materials may be plated on one heat spreader component and the other component of the dual component bonding materials may be plated on another heat spreader component. When the two components of the dual component bonding materials are brought into contact, they liquefy and later solidify due to diffusion.

Figure 11:
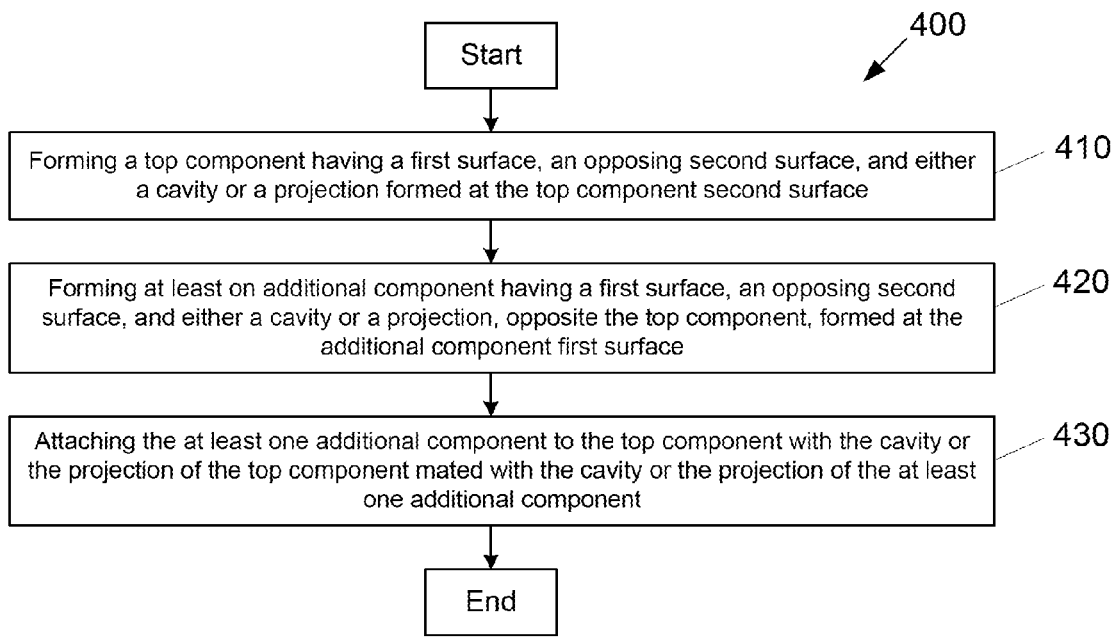
FIG. 11 is a flow chart of a process of fabricating an integrated heat spreader, according to an embodiment of the present description.

FIG. 11 is a flow chart of a process 400 of fabricating a multi-component integrated heater spreader according to an embodiment of the present description, such as illustrated in FIGS. 2-10. As set forth in block 410, a top component may be formed having a first surface, an opposing second surface, and a cavity or a projection formed at the top component second surface. At least one additional component may be formed having a first surface, an opposing second surface, and a cavity or a projection, differing from the top component formed at the additional component first surface, as set forth in block 420. As set forth in block 430, the at least one additional component may be attached to the top component with the cavity or the projection of the top component mated with the cavity or the projection of the at least one additional component.

Figure 12:
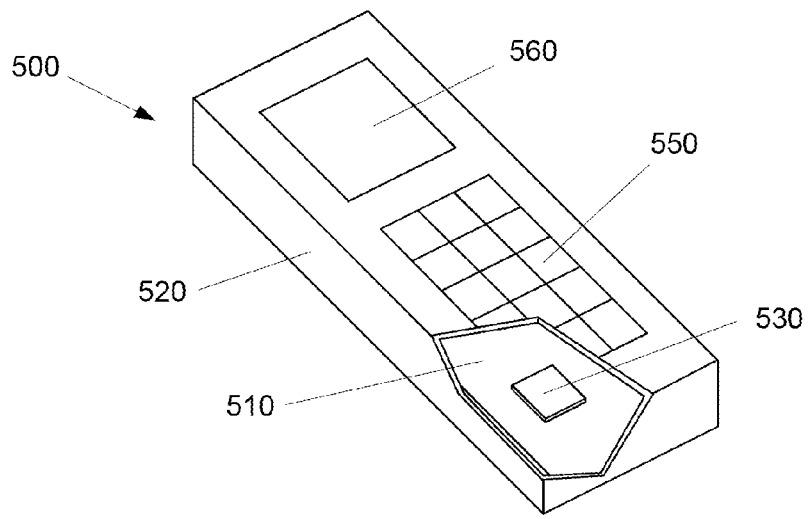
FIG. 12 is an electronic device/system, according to an embodiment of the present description.

FIG. 12 illustrates an embodiment of an electronic system/device 500, such as a portable computer, a desktop computer, a mobile telephone, a digital camera, a digital music player, a web tablet/pad device, a personal digital assistant, a pager, an instant messaging device, or other devices. The electronic system/device 500 may be adapted to transmit and/or receive information wirelessly, such as through a wireless local area network (WLAN) system, a wireless personal area network (WPAN) system, and/or a cellular network. The electronic system/device 500 may include a microelectronic motherboard or substrate 510 disposed within a device housing 520. The microelectronic motherboard/substrate 510 may have various electronic components electrically coupled thereto including an integrated heat spreader 530, as described in the embodiments of the present description, attached to the microelectronic motherboard/substrate 510, wherein a multi-chip package (not shown) is disposed between the integrated heat spreader 530 and the microelectronic motherboard/substrate 510. The microelectronic motherboard/substrate 510 may be attached to various peripheral devices including an input device 550, such as keypad, and a display device 560, such an LCD display. It is understood that the display device 560 may also function as the input device, if the display device 560 is touch sensitive.

It is understood that the subject matter of the present description is not necessarily limited to specific applications illustrated in FIGS. 1-12. The subject matter may be applied to other microelectronic device and assembly applications, as well as any appropriate heat removal application, as will be understood to those skilled in the art.

The following examples pertain to further embodiments. Specifics in the examples may be used anywhere in one or more embodiments.

In Example 1, a multi-component integrated heat spreader may comprise a top component having a first surface, an opposing second surface, and one of a cavity or a projection formed at the top component second surface; at least one additional component having a first surface, an opposing second surface, and a cavity or a projection, differing from the top component, formed at the additional component first surface; and wherein the at least one additional component is attached to the top component with the cavity or the projection of the top component is mated with the cavity or the projection of the at least one additional component.

In Example 2, the subject matter of Example 1 can optionally include the additional component attached to the top component with a brazing alloy.

In Example 3, the subject matter of any one of Examples 1-2 can optionally include the cavity of either the top component or the additional component comprising a trench, and the projection of the other of the top component or the additional component may comprising a ridge.

In Example 4, the subject matter of any one of Examples 1-2 can optionally include the cavity of either the top component or the additional component comprises a plurality of conical cavities, and wherein the projection of the other of the top component or the additional component comprises a plurality of cone-shaped projections.

In Example 5, the subject matter of any one of Examples 1-4 can optionally include the additional component comprising a footing component.

In Example 6, the subject matter of Example 5 can optionally include the footing component having a handling feature defined therein.

In Example 7, the subject matter of Example 6 can optionally include the footing component having an indent first surface and an indent second surface, wherein the footing component indent first surface, the footing component indent second surface, and the top component second surface defines a handling feature.

In Example 8, the subject matter of any one of Examples 1-4 can optionally include the additional component comprising a spacer component.

In Example 9, a method of fabricating a multi-component integrated heat spreader may comprise forming a top component having a first surface, an opposing second surface, and one of a cavity or a projection is formed at the top component second surface; forming at least one additional component having a first surface, an opposing second surface, and a cavity or a projection, differing from the top component, formed at the additional component first surface; and attaching the at least one additional component to the top component with the one of the cavity or the projection of the top component mated with the cavity or the projection of the at least one additional component.

In Example 10, the subject matter of Example 9 can optionally include attaching the additional component to the top component with a brazing alloy.

In Example 11, the subject matter of any one of Examples 9-10 can optionally include forming the cavity of either the top component or the additional component comprises forming a trench, and wherein forming the projection of the other of the top component or the additional component comprises forming a ridge.

In Example 12, the subject matter of any one of Examples 9-11 can optionally include forming the cavity of either the top component or the additional component comprises forming a plurality of conical cavities, and wherein forming the projection of the other of the top component or the additional component comprises forming a plurality of cone-shaped projections.

In Example 13, the subject matter of any one of Examples 9-12 can optionally include forming the additional component comprises forming a footing component.

In Example 14, the subject matter of any one of Examples 9-13 can optionally include defining a handling feature in the footing component.

In Example 15, the subject matter of Example 14, can optionally include forming an indent first surface and forming an indent second surface in the footing component, wherein the footing component indent first surface, the footing component indent second surface, and the top component second surface define the handling feature.

In Example 16, the subject matter of any of Examples 9-12, can optionally include forming the additional component comprising forming a spacer component.

In Example 17, a microelectronic system may comprise a multi-chip package comprising at least one microelectronic device having a first surface and an opposing second surface, wherein the microelectronic device first surface is electrically connected to a microelectronic substrate; and a multi-component integrated heat spreader attached to the multi-chip package, comprising: a top component having a first surface, an opposing second surface, and one of a cavity or a projection formed at the top component second surface; at least one footing component having a first surface, an opposing second surface, and one of a cavity or a projection differing from the top component at the footing component first surface, wherein the at least one footing component is attached to the top component with the cavity or the projection of the top component mated with the cavity or projection of the at least one additional component, and wherein the footing component second surface is attached to the microelectronic substrate; and at least one spacer component having a first surface, an opposing second surface, and one of a cavity or a projection differing form the top component at the spacer component first surface, wherein the at least one spacer component is attached to the top component with the one of the cavity or the projection of the top component mated with the differing cavity or projection of the at least one spacer component, and wherein the spacer component second surface is in thermal contact with the at least one microelectronic device second surface.

In Example 18, the subject matter of Example 17 can optionally include the footing component being attached to the top component with a brazing alloy.

In Example 19, the subject matter of any one of Examples 17-18 can optionally include the spacer component being attached to the top component with a brazing alloy.

In Example 20, the subject matter of any one of Examples 17-19 can optionally include the footing component having a handling feature defined therein.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A multi-component integrated heat spreader, comprising:
    a top component having a first surface, an opposing second surface, and either a cavity or a projection formed at the top component second surface;
    at least one footing component having a first surface, an opposing second surface, and either a cavity or a projection, differing from the top component cavity or projection, formed at the at least one footing component first surface; and
    wherein the at least one footing component is attached to the top component with the cavity or the projection of the top component mated with the cavity or the projection of the at least one footing component, wherein the at least one footing component includes an indent first surface and an indent second surface, and wherein the at least one footing component indent first surface, the at least one footing component indent second surface, and the top component second surface define a handling feature.

2. The multi-component integrated heat spreader of claim 1, wherein the at least one footing component is attached to the top component with a brazing alloy.

3. The multi-component integrated heat spreader of claim 1, wherein the cavity of either the top component or the at least one footing component comprises a trench, and wherein the projection of the other of the top component or the at least one footing component comprises a ridge.

4. The multi-component integrated heat spreader of claim 1, wherein the cavity of either the top component or the at least one footing component comprises a plurality of conical cavities, and wherein the projection of the other of the top component or the at least one footing component comprises a plurality of cone-shaped projections.

5. A method of fabricating a multi-component integrated heat spreader, comprising:
    forming a top component having a first surface, an opposing second surface, and either a cavity or a projection formed at the top component second surface;

forming at least one footing component having a first surface, an opposing second surface, and either cavity or a projection, differing from the top component cavity or projection, formed at the at least one footing component first surface;

attaching the at least one footing component to the top component with the one of the cavity or the projection of the top component mated with the cavity or the projection of the at least one footing component; and forming an indent first surface and forming an indent second surface in the at least one footing component, wherein the at least one footing component indent first surface, the at least one footing component indent second surface, and the top component second surface define a handling feature.

6. The method of claim 5, wherein attaching the at least one footing component to the top component comprises attaching the at least one footing component to the top component with a brazing alloy.

7. The method of claim 5, wherein forming the cavity of either the top component or the at least one footing component comprises forming a trench, and wherein forming the projection of the other of the top component or the at least one footing component comprises forming a ridge.

8. The method of claim 5, wherein forming the cavity of either the top component or the at least one footing component comprises forming a plurality of conical cavities, and wherein forming the projection of the other of the top component or the at least one footing component comprises forming a plurality of cone-shaped projections.

9. A microelectronic system, comprising:
a multi-chip package comprising at least one microelectronic device having a first surface and an opposing second surface, wherein the microelectronic device first surface is electrically connected to a microelectronic substrate; and
a multi-component integrated heat spreader attached to the multi-chip package, comprising:
a top component having a first surface, an opposing second surface, and either a cavity or a projection formed at the top component second surface;
at least one footing component having a first surface, an opposing second surface, and either a cavity or a projection, differing from the top component, at the footing component first surface, wherein the at least one footing component is attached to the top component with the cavity or the projection of the top component mated with the cavity or projection of the at least one footing component, wherein the at least one footing component includes an indent first surface and an indent second surface, and wherein the at least one footing component indent first surface, the at least one footing component indent second surface, and the top component second surface define a handling feature, and wherein the footing component second surface is attached to the microelectronic substrate; and
at least one spacer component having a first surface, an opposing second surface, and either a cavity or a projection, differing form the top component cavity or projection, at the spacer component first surface, wherein the at least one spacer component is attached to the top component with the one of the cavity or the projection of the top component mated with the differing cavity or projection of the at least one spacer component, and wherein the spacer component second surface is in thermal contact with the at least one microelectronic device second surface.

10. The microelectronic system of claim 9, wherein the footing component is attached to the top component with a brazing alloy.

11. The microelectronic system of claim 9, wherein the spacer component is attached to the top component with a brazing alloy.

* * * * *